United States Patent [19]

Kadota

[11] Patent Number: 5,719,538
[45] Date of Patent: Feb. 17, 1998

[54] SURFACE ACOUSTIC WAVE DEVICE HAVING NEGATIVE TEMPERATURE COEFFICIENT OF DECAY

[75] Inventor: Michio Kadota, Kyoto, Japan

[73] Assignee: Murata Manufacturing Co., Ltd., Kyoto, Japan

[21] Appl. No.: 697,822

[22] Filed: Aug. 30, 1996

[30] Foreign Application Priority Data

Sep. 1, 1995 [JP] Japan .................. 7-225270

[51] Int. Cl.⁶ .................................. H03H 9/64
[52] U.S. Cl. .............. 333/193; 310/313 A; 310/313 B
[58] Field of Search ........................... 333/193–196; 310/313 R, 313 A, 313 B, 313 C, 313 D

[56] References Cited

U.S. PATENT DOCUMENTS

| | | | |
|---|---|---|---|
| 4,511,816 | 4/1985 | Mikoshiba et al. | 333/155 |
| 4,516,049 | 5/1985 | Mikoshiba et al. | 333/155 |
| 4,752,709 | 6/1988 | Fujishima et al. | 310/313 A |
| 4,879,487 | 11/1989 | Sugai et al. | 333/193 |
| 5,334,960 | 8/1994 | Penunnuri | 333/195 |
| 5,401,544 | 3/1995 | Nakahata et al. | 310/313 A |
| 5,521,454 | 5/1996 | Hattori et al. | 310/313 R |

FOREIGN PATENT DOCUMENTS

| | | |
|---|---|---|
| 534252 | 3/1993 | European Pat. Off. |
| 55-77223 | 6/1980 | Japan |
| 56-31213 | 3/1981 | Japan |
| A 61-092021 | 5/1986 | Japan |
| A 61-195013 | 8/1986 | Japan |

OTHER PUBLICATIONS

"Control of Second–Order Temperature Coefficients of Delay Time for SAW Propagating in Thin–Film Layers", Electronics and Communications in Japan, Part 3, vol. 77, No. 4, 1994.

European Search Report for co–pending European Patent Application No. EP–96 11 3941 corresponding to U.S. Patent Application No. 08/697,822.

*Primary Examiner*—Robert Pascal
*Assistant Examiner*—Barbara Summons
*Attorney, Agent, or Firm*—Graham & James LLP

[57] ABSTRACT

A surface acoustic wave device using a quartz substrate has a larger electromechanical coupling coefficient than conventional devices. The SAW device is constructed by forming a thin ZnO film on a quartz substrate and disposing comb-like electrodes on the ZnO film.

8 Claims, 12 Drawing Sheets

SURFACE ACOUSTIC WAVE DEVICE HAVING NEGATIVE TEMPERATURE COEFFICIENT OF DECAY

BACKGROUND OF THE INVENTION

1. Field of the Invention

The present invention relates to a surface acoustic wave device using a quartz substrate. More particularly, the invention relates to an improvement in a surface acoustic wave device using a surface acoustic wave substrate formed by stacking a thin piezoelectric film on a quartz substrate.

2. Description of the Related Art

Known, surface acoustic wave devices (hereinafter referred to as "the SAW device") are widely used for a bandpass filter in, for example, a mobile communication apparatus or the like. The SAW device has at least one interdigital transducer (hereinafter referred to as "the IDT") formed of at least one pair of comb-like electrodes disposed in contact with a piezoelectric member.

Further, various types of SAW devices each using a thin piezoelectric film have been suggested, for example, a SAW device using a surface acoustic wave substrate (hereinafter referred to as "the SAW substrate") obtained by forming a thin piezoelectric film on a glass substrate or a piezoelectric substrate.

Four types of known SAW devices using a combination of the above-described thin piezoelectric film and a glass substrate are shown in FIGS. 1A, 1B, 2A and 2B. More specifically, in a SAW device generally designated by 1 illustrated in FIG. 1A, a thin ZnO film 3 is formed as a thin piezoelectric film on a glass substrate 2, and IDTs 4 are deposited on the ZnO film 3. On the other hand, in a SAW device generally indicated by 5 shown in FIG. 1B, the IDTs 4 are formed on the bottom surface of the ZnO film 3, i.e., at the interface between the glass substrate 2 and the ZnO film 3.

Figure 1A:
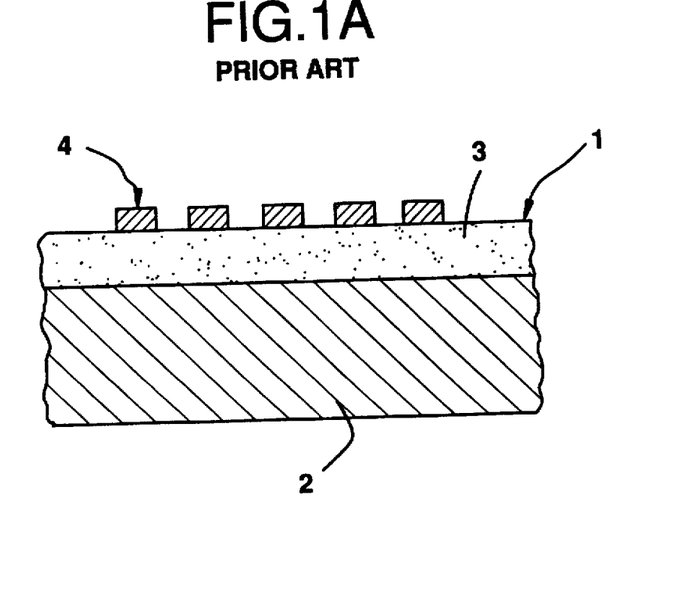
FIGS. 1A and 1B are sectional views of the structure of a conventional SAW device in which a glass substrate, a thin piezoelectric film and IDTs are stacked on each other.
Figure 1B:
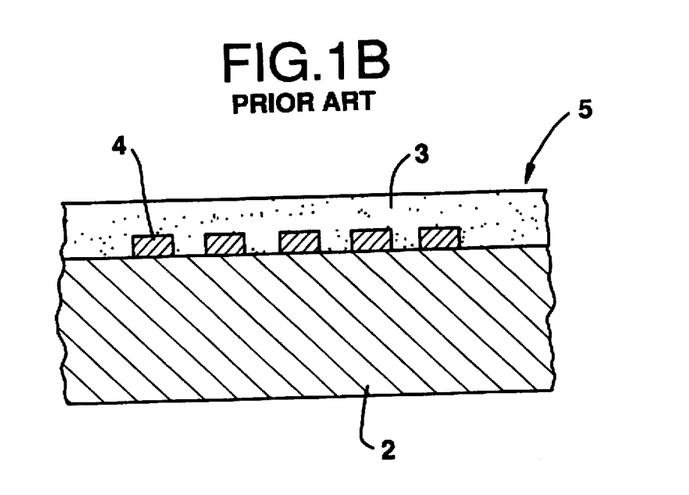
Figure 2A:
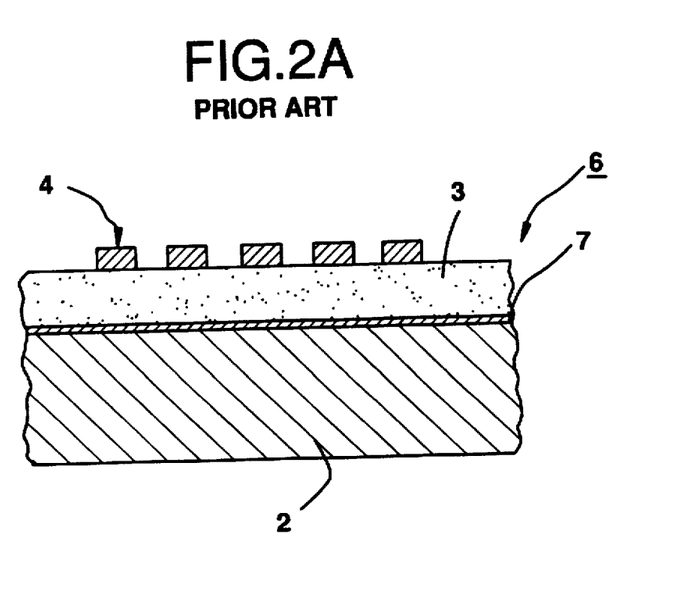
FIGS. 2A and 2B, are sectional views of the structure of a conventional SAW device in which a glass substrate, a short-circuit electrode, a thin piezoelectric film and IDTs are stacked on each other.

Moreover, in a SAW device generally designated by 6 shown in FIG. 2A, a short-circuit electrode 7 is formed on the glass substrate 2, and the thin ZnO film 3 is stacked on the short-circuit electrode 7. IDTs 4 are deposited on the ZnO film 3. The SAW device 6 is similar to the SAW device 1 illustrated in FIG. 1A except for having the short-circuit electrode 7 inserted at the interface between the glass substrate 2 and the ZnO film 3. On the other hand, in a SAW device generally indicated by 8 shown in FIG. 2B, the short-circuit electrode 7 is deposited on the ZnO film 3, and the IDTs 4 are located at the interface between the glass substrate 2 and the ZnO film 3. That is, the SAW device 8 is similar to the SAW device 5 illustrated in FIG. 1B except for having the short-circuit electrode 7 deposited on the top surface of the thin ZnO film 3.

Figure 3:
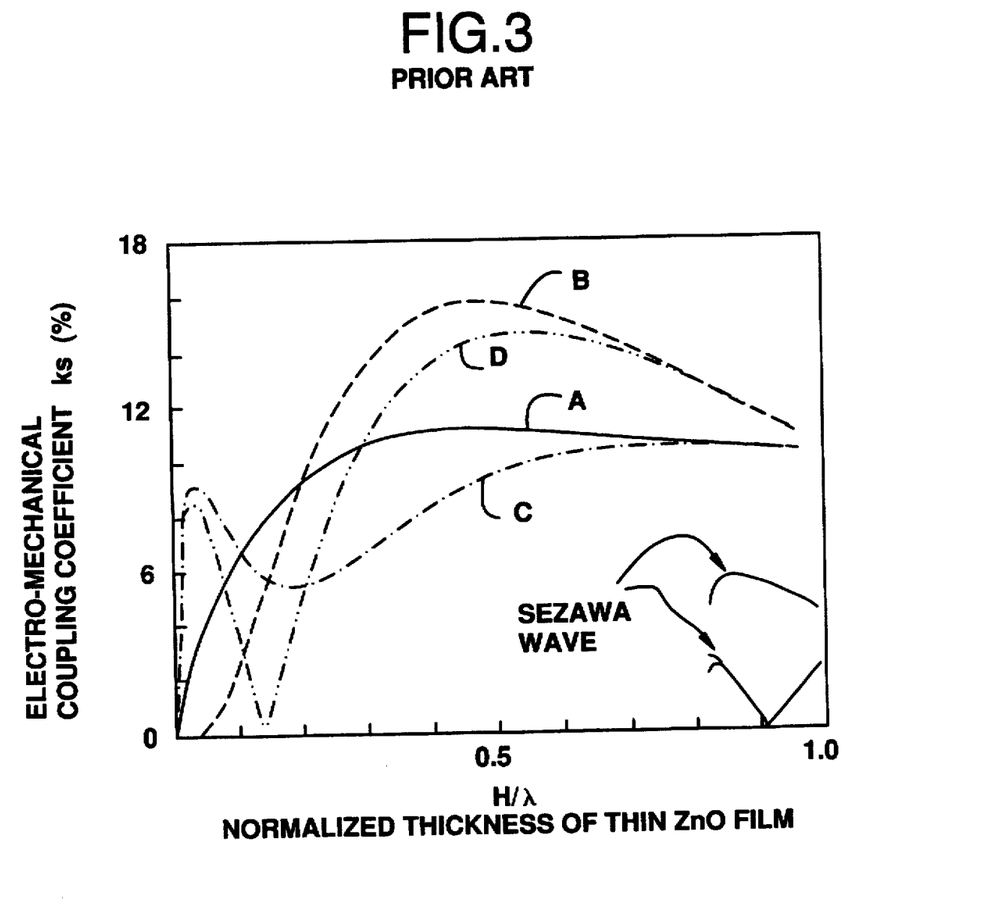
FIG. 3 is a diagram indicating the relationship between the electromechanical coupling coefficient and the normalized thickness of a thin piezoelectric film for use in the SAW device shown in FIGS. 1 and 2.

FIG. 3 illustrates the electromechanical coupling coefficient obtained when the SAW devices 1, 5, 6 and 8 are constructed in a manner similar to each other, except for the positions of the IDTs 4 and the presence of the short circuit electrode 7. FIG. 3 shows a change in the electro-mechanical coupling coefficient with respect to the ratio of the thickness H of the ZnO film of the above-described four types of SAW devices 1, 5, 6 and 8 to a wavelength $\lambda$ of a surface acoustic wave to be excited (hereinafter referred to as "the normalized thickness H/$\lambda$"). Throughout this specification, H indicates the thickness of the ZnO film and $\lambda$ represents a wavelength of the SAW to be excited. The solid line A indicates a change in H/$\lambda$ of the SAW device 1; the broken line B designates a change in H/$\lambda$ of the SAW device 5; the one-dot-chain line C represents a change in H/$\lambda$ of the SAW device 6; and the two-dot-chain line D depicts a change in H/$\lambda$ of the SAW device 8.

FIG. 3 shows that the SAW devices 5 and 8 can achieve a large electromechanical coupling coefficient compared to the SAW devices 1 and 6 by carefully controlling the value of H/$\lambda$ to have a desired value that produces a greater electromechanical coupling coefficient. Accordingly, regarding the SAW device constructed in which the thin ZnO film 3 is formed on the glass substrate 2, it has been conventionally considered that a larger electromechanical coupling coefficient can be obtained by forming the IDTs 4 at the interface between the glass substrate 2 and the ZnO film 3. The Sezawa wave shown in FIG. 3 is a SAW in a higher-order mode of the Rayleigh SAW.

Moreover, *Jpn. J. Appl. Phys.* Vol. 32 (1993), pages 2333 to 2336 discloses a change in the electro-mechanical coupling coefficient depending on the positions of the IDTs and the short-circuit electrode when a SAW substrate having a thin ZnO film formed on a LiNbO$_3$ piezoelectric single-crystal substrate is used. This change will now be explained with reference to FIGS. 4A, 4B, 5A and 5B.

Figure 2B:
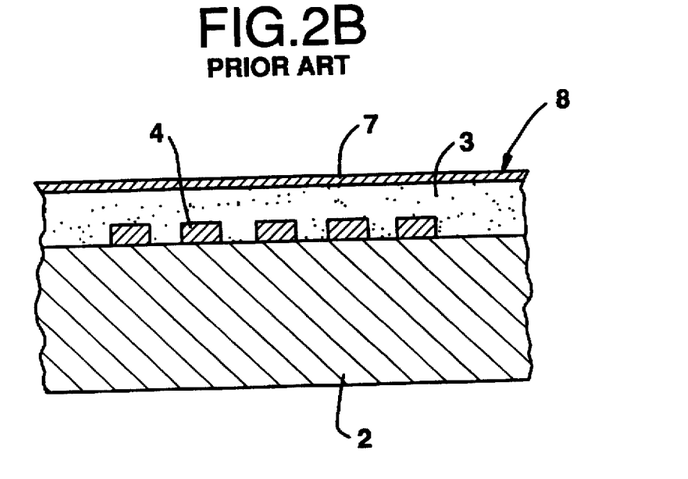
Figure 4A:
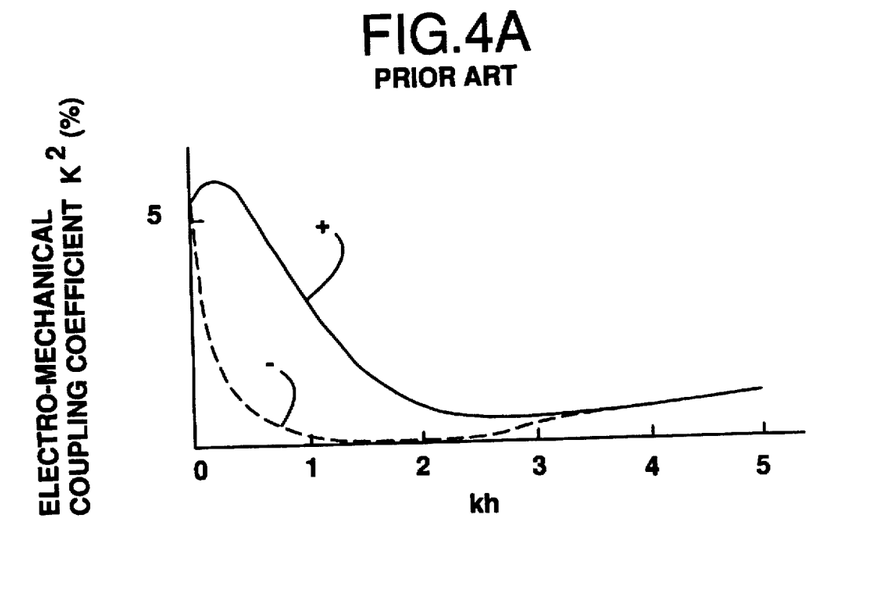
FIG. 4A illustrates a relationship between the normalized thickness of a ZnO film and the electromechanical coupling coefficient obtained in the structure of a conventional SAW device in which a thin piezoelectric film is formed on a LiNbO$_3$ substrate and IDTs are disposed on the film.
Figure 4B:
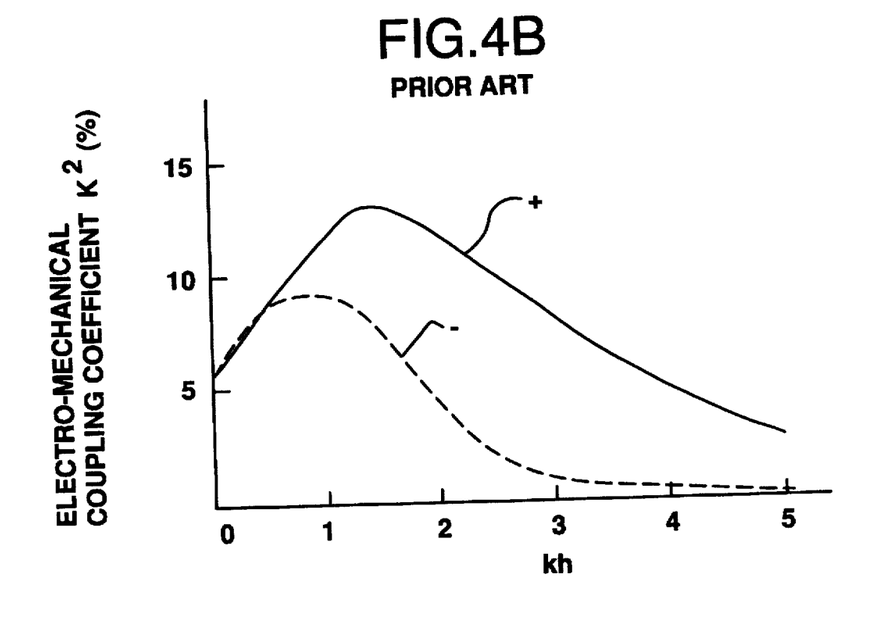
FIG. 4B illustrates a relationship between the normalized thickness of a ZnO film and the electromechanical coupling coefficient obtained in the structure of a conventional SAW device in which a thin piezoelectric film is formed on a LiNbO$_3$ substrate and IDTs are disposed between the film and the substrate.

FIG. 4A illustrates the relationship between the electromechanical coupling coefficient $K^2$ and the relative thickness kh (k indicates $2\pi/\lambda$, and h designates the thickness of a thin ZnO film) of the thin ZnO film of the SAW device constructed by replacing the glass substrate 2 of the SAW device 1 shown in FIG. 1A with a LiNbO$_3$ piezoelectric single-crystal substrate. The solid line indicated by + represents characteristics obtained when the ZnO film is formed on the positive surface on the LiNbO$_3$ substrate, while the broken line indicated by − designates characteristics obtained when the ZnO film is deposited on the negative surface of the LiNbO$_3$ substrate. Similarly, FIG. 4B illustrates the relationship between the electromechanical coupling coefficient $K^2$ and the relative thickness kh of the SAW device constructed by replacing the glass substrate 2 of the SAW device 5 shown in FIG. 1B with a LiNbO$_3$ piezoelectric single-crystal substrate. The solid line indicated by + designates characteristics obtained when the ZnO film is formed on the positive surface of the LiNbO$_3$ substrate, while the broken line represented by − indicates characteristics obtained when the ZnO film is deposited on the negative surface of the substrate. Further, FIGS. 5A and 5B respectively illustrate a change in the electromechanical coupling coefficient $K^2$ resulting when the glass substrates 2 of the SAW devices 6 and 8 illustrated in FIGS. 2A and 2B are replaced with LiNbO$_3$ piezoelectric single-crystal substrates.

Figure 5A:
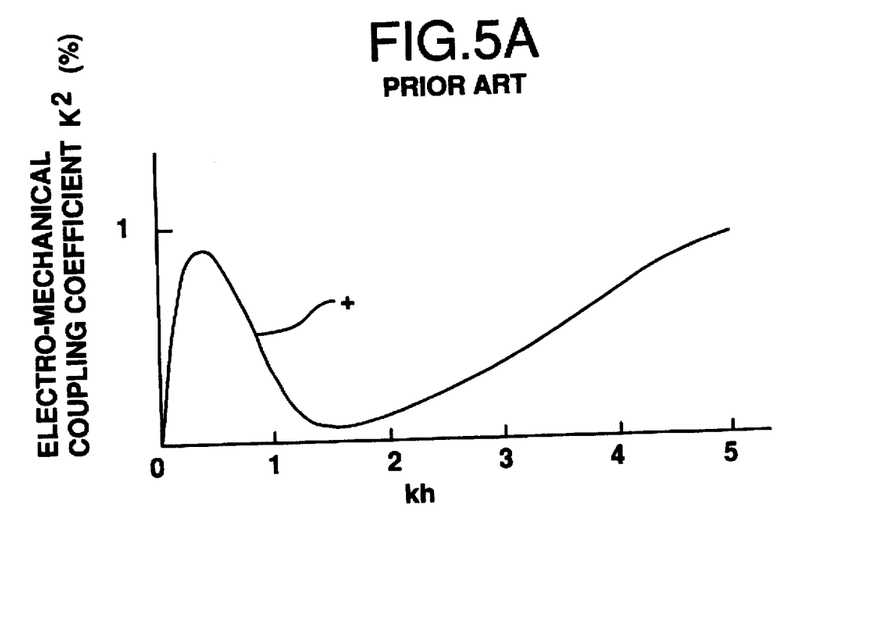
FIG. 5A illustrates a relationship between the normalized thickness of a ZnO film and the electromechanical coupling coefficient obtained in the structure of a SAW device having a thin ZnO film formed on a LiNbO$_3$ substrate in which IDTs are formed on the film and a short-circuit electrode is inserted between the film and the substrate.
Figure 5B:
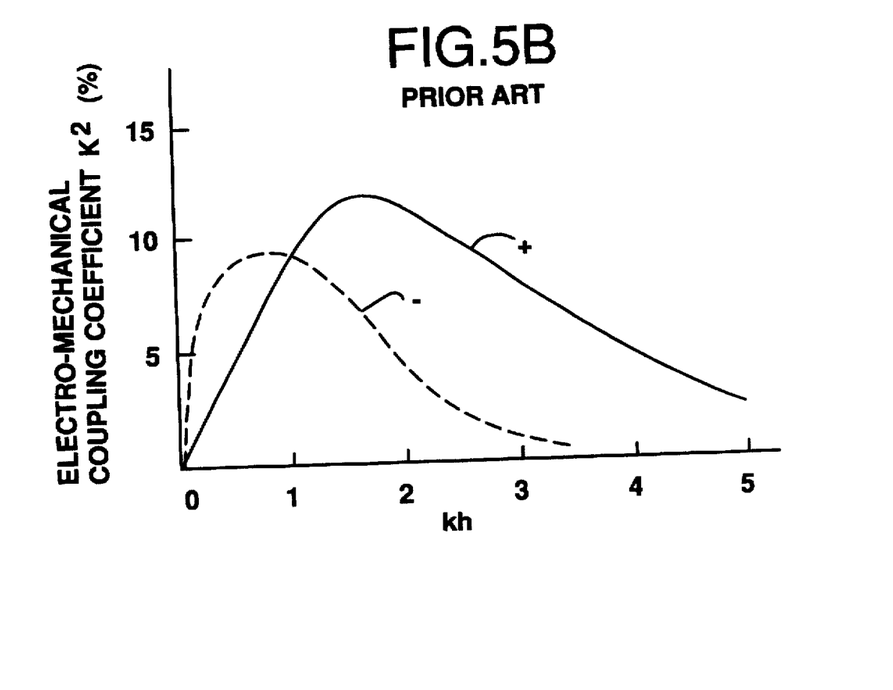
FIG. 5B illustrates a relationship between the normalized thickness of a ZnO film and the electromechanical coupling coefficient obtained in the structure of a SAW device having a thin ZnO film formed on a LiNbO$_3$ substrate in which IDTs are formed between the film and the substrate and a short-circuit electrode is disposed on the film.

FIGS. 4 and 5 reveal that in the SAW devices constructed by depositing a thin ZnO film on the LiNbO$_3$ piezoelectric single-crystal substrate used as a piezoelectric thin film, as well as on the glass substrate, a large electromechanical coupling coefficient $K^2$ can be achieved by forming the IDTs at the interface between the substrate and the ZnO film, as shown in FIGS. 4B and 5B. Namely, it has been conventionally considered that by use of a SAW substrate having a thin ZnO film on a glass substrate or a thin piezoelectric substrate, IDTs should be formed between the piezoelectric film and the substrate in order to achieve a large electromechanical coupling coefficient.

On the other hand, for the application of SAW devices to specific uses, there is an increasing demand for SAW substrates having not only a large electromechanical coupling coefficient but also good temperature characteristics, i.e., exhibiting good characteristics in which a minimal temperature change in the substrate is ensured in response to temperature changes. Quartz is, on one hand, known as a substrate material having good temperature characteristics, but on the other hand, has a comparatively small electromechanical coupling coefficient.

One of the ways to overcome the above drawback is a SAW device using a SAW substrate constructed by stacking a thin piezoelectric film, such as a thin ZnO film, on a quartz substrate. As described above, it has been considered that IDTs should be disposed at the interface between the piezoelectric substrate and the piezoelectric thin film in order to obtain a large electromechanical coupling coefficient. In reality, however, not many SAW devices use a SAW substrate formed by stacking a thin ZnO film on a quartz substrate. it has been validated that a larger electromechanical coupling coefficient cannot be exhibited by constructing the SAW devices in such a manner that a thin ZnO film is formed on the quartz substrate with IDTs disposed between the film and the substrate. Thus, a SAW substrate having a larger electromechanical coupling coefficient is still needed.

Figure 10:
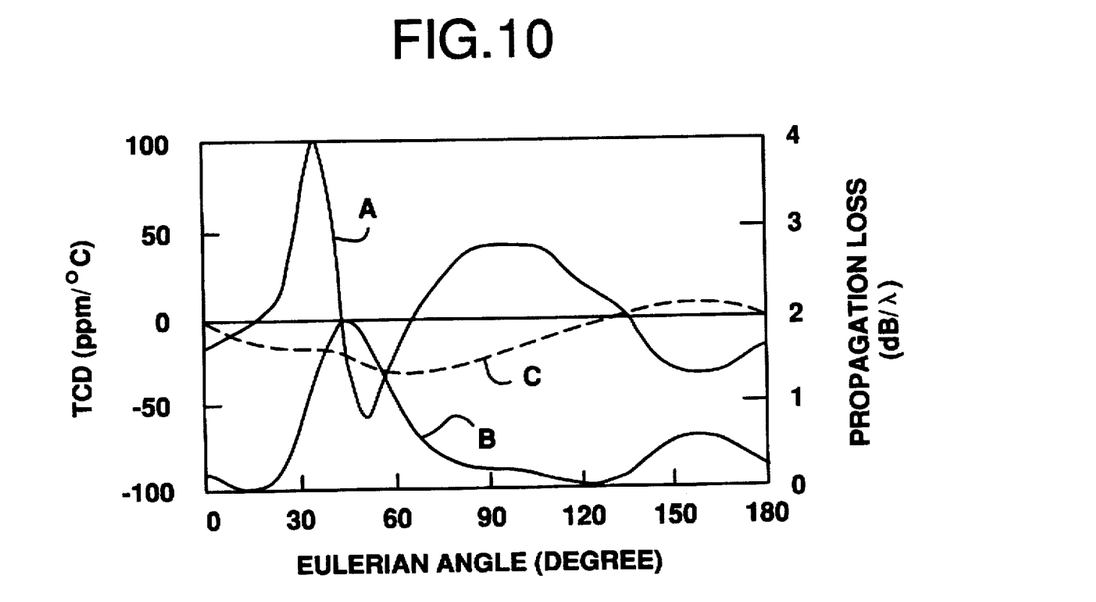
FIG. 10 illustrates the relationship of the Eulerian angles of a Y-direction rotating quartz substrate to the TCD and the propagation losses.

On the other hand, the quartz substrate possesses good temperature characteristics, as discussed above. For example, a Y-cut rotated quartz substrate is known to have the relationship shown in FIG. 10 of the Eulerian angles to the temperature coefficient delay time (TCD) (ppm/°C.) and the propagation losses. Referring to FIG. 10, the solid line A indicates the TCD obtained when a leaky SAW is excited on the Y-cut rotated quartz substrate; the solid line B represents propagation losses; and the broken line C designates the TCD of the Rayleigh SAW. It should be noted that the propagation losses of the Rayleigh SAW is zero.

Based on the known TCD and the propagation loss characteristics illustrated in FIG. 10, a Y-cut rotated quartz substrate having an Eulerian angle at approximately 130 degrees shown in FIG. 10 is conventionally used. In other words, a quartz substrate having such a cut angle as to exhibit approximately zero TCD is used, and IDTs are disposed on the quartz substrate. A resulting SAW device is considered to exhibit good temperature characteristics.

However, only a small electromechanical coupling coefficient can be obtained by use of the SAW device using the quartz substrate constructed as described above. This makes it difficult to obtain filter characteristics having low insertion losses or a wide band range when the aforesaid SAW device is for use in, for example, a SAW filter.

SUMMARY OF THE INVENTION

To overcome the above-noted problems with the prior art, the preferred embodiments of the present invention provide a SAW device using a SAW substrate formed by stacking a thin piezoelectric film on a quartz substrate so as to have a structure in which an improvement is made to obtain a substantially higher electromechanical coupling coefficient as compared to prior art devices.

The preferred embodiments of the present invention also provide a SAW device having good temperature characteristics exhibiting a substantially larger electromechanical coupling coefficient as compared to prior art devices.

According to a first preferred embodiment of the present invention, there is provided a surface acoustic wave device comprising a quartz substrate, a thin piezoelectric film disposed on the quartz substrate, and comb-like electrodes disposed on the thin piezoelectric film.

In this surface acoustic wave device, the thin piezoelectric film is formed on the quartz substrate, and the comb-like electrodes are disposed on the piezoelectric film. More specifically, it has been conventionally considered that when using a surface acoustic wave substrate formed by stacking a thin piezoelectric film on a non-piezoelectric substrate or a piezoelectric substrate, IDTs and comb-like electrodes should be disposed between the substrate and the film. This may achieve a large electromechanical coupling coefficient. However, the present inventor discovered that an electromechanical coupling coefficient can be improved by forming a thin piezoelectric film on a piezoelectric quartz substrate and further disposing comb-like electrodes on the film. The first preferred embodiment of the present invention was thus accomplished based on the above-noted discovery made by the present inventor.

In the aforesaid surface acoustic wave device of the first preferred embodiment, a short-circuit electrode may preferably be disposed between the quartz substrate and the piezoelectric film.

According to a further modification of the first preferred embodiment of the present invention, a normalized thickness $H/\lambda$ of the thin piezoelectric film may be about 0.05 or greater where the thickness of the piezoelectric film is H and a wavelength of a surface acoustic wave is $\lambda$, thereby further enhancing an electro-mechanical coupling coefficient.

According to a second preferred embodiment of the present invention, there is provided a surface acoustic wave device comprising, a quartz substrate, a thin piezoelectric film disposed on the quartz substrate, and comb-like electrodes disposed to contact the thin piezoelectric film, wherein the quartz substrate uses a quartz substrate having such a cut angle and a propagation direction as to exhibit a negative value of the temperature coefficient delay time (TCD).

In the above-described surface acoustic wave device, a quartz substrate having such a cut angle and a propagation direction as to exhibit a negative value of the temperature coefficient delay time (TCD) is preferably used, and a thin piezoelectric film, normally having a positive value of the TCD, is stacked on the quartz substrate. Hence, in this device, the TCD of the piezoelectric film is offset by that of the quartz substrate, thereby achieving good temperature characteristics.

On the other hand, as will be described below, a quartz substrate having such a cut angle and a propagation direction as to exhibit a negative value of the TCD possesses a larger electromechanical coupling coefficient over quartz substrates having such cut angles and propagation directions as to exhibit approximately a zero value for the TCD. It is thus possible to provide a surface acoustic wave device having good temperature characteristics and also exhibiting a larger electromechanical coupling coefficient.

According to a modification of the second preferred embodiment of the present invention, the comb-like electrodes may be formed on the piezoelectric film, and thus, a larger electromechanical coupling coefficient can be achieved by this device, as well as the device of the first preferred embodiment of the present invention.

Further, according to another specific modification of the second preferred embodiment of the present invention, the surface acoustic wave device may further comprise a short-circuit electrode disposed between the quartz substrate and the thin piezoelectric film, thereby enhancing the electromechanical coupling coefficient.

Moreover, according to another specific modification of the second preferred embodiment of the present invention, a normalized thickness $H/\lambda$ of the thin piezoelectric film may be about 0.03 or greater where the thickness of the thin piezoelectric film is H and a wavelength of a surface acoustic wave is λ.

In the first and second preferred embodiments of the present invention, the thin piezoelectric film preferably comprises one of the compounds selected from the group consisting of ZnO, AlN, Ta$_2$O$_5$ and CdS. Alternatively, other types of thin piezoelectric film may be employed. Accordingly, in the second preferred embodiment of the present invention, the piezoelectric film is preferably formed of one of the above-described compounds, thereby providing a surface acoustic wave device having good temperature characteristics.

The surface acoustic wave devices of the first and second preferred embodiments of the present invention are applicable to various SAW devices, such as SAW filters, SAW resonators, SAW delay lines, etc.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

A preferred embodiment of the present invention will now be described through illustration of specific examples with reference to the drawings.

EXAMPLE 1

ST-cut quartz substrates propagating in the X direction and having a diameter of about 76.2 mm and a thickness of about 0.5 mm were used to produce the following three types of SAW devices.

Figure 9A:
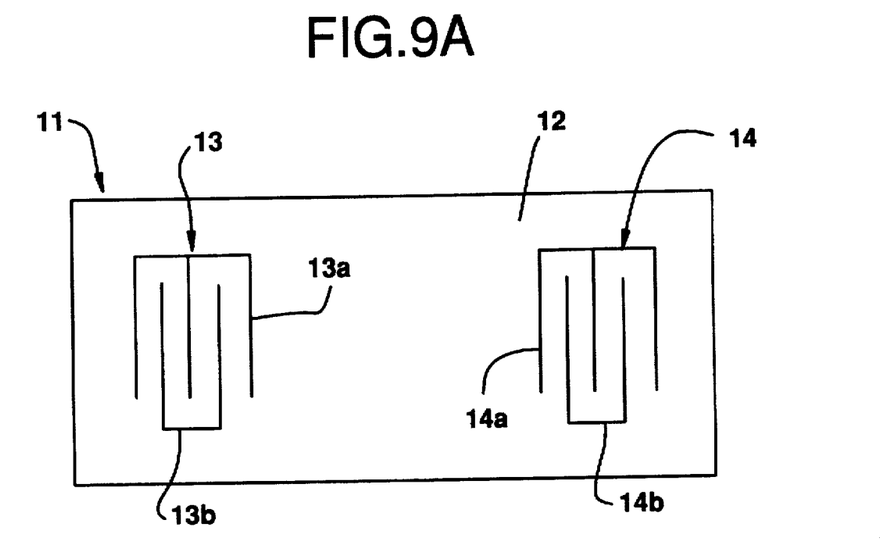
FIG. 9A is a schematic plan view of a preferred embodiment of a SAW device of the present invention.
Figure 9B:
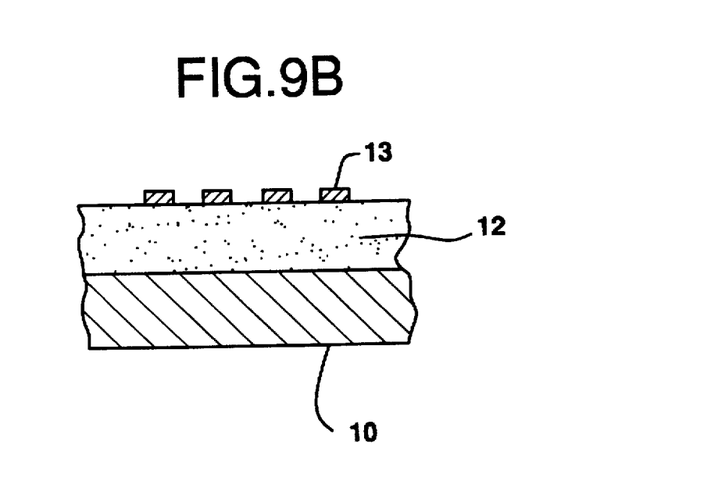
FIG. 9B is a partially cutaway sectional view of the portion of the SAW device of FIG. 9A in which comb-like electrodes are formed.

A SAW device 11 as shown in FIGS. 9A and 9B was produced by the following procedure. A thin ZnO 12 film was formed on the entire surface of the above-described quartz substrate 10, and two IDTs 13 and 14 were deposited on the ZnO film so as to extend across a predetermined distance to produce a SAW filter. More specifically, IDTs 13 and 14 having a pair of comb-like electrodes 13a and 13b and a pair of comb-like electrodes 14a and 14b, respectively, were formed, as shown in FIG. 9A, on a thin piezoelectric film 12 spaced from each other by a predetermined distance. Further, in this SAW device 11, a thin ZnO film 12 was formed, as illustrated in FIG. 9B, on the above-described quartz substrate 10. A SAW device 20 (not shown) was then produced in a manner similar to the SAW device 11, except that the IDTs 13 and 14 were formed between the quartz substrate 10 and the thin ZnO film 12. Moreover, a SAW device 30 (not shown) was made in a manner similar to the SAW device 11, except that an Aluminum short-circuit electrode was formed at the interface between the ZnO film 12 and the quartz substrate 10.

Figure 6:
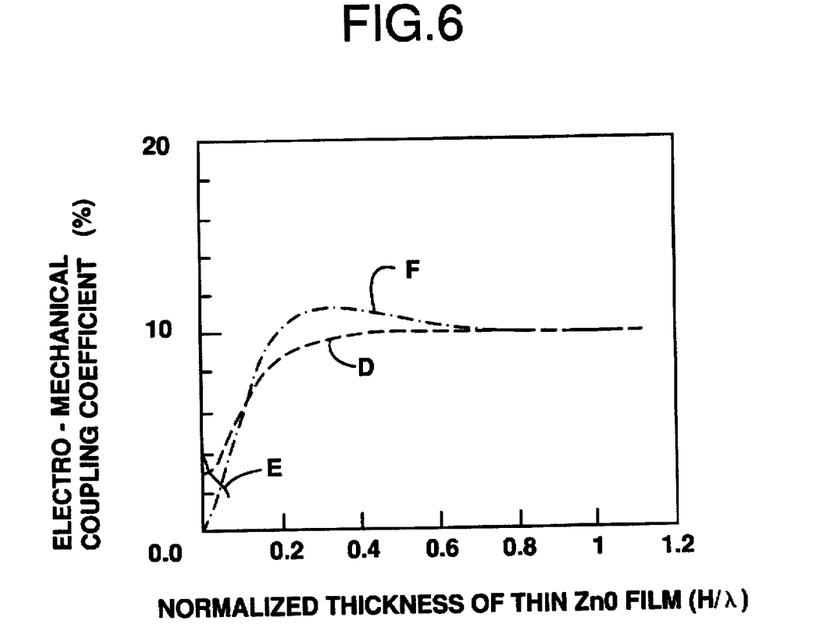
FIG. 6 is a diagram representing the relationship between the electromechanical coupling coefficient and the normalized thickness of a thin ZnO film for use in three types of SAW devices each having a thin piezoelectric film and comb-like electrodes variously formed on a ST-cut quartz substrate.

In the SAW devices 11, 20, 30 produced as described above, the thickness of the thin ZnO film was varied to determine the relationship between the thickness of the ZnO film and the electromechanical coupling coefficient. The results are shown in FIG. 6. The horizontal axis of FIG. 6 indicates the normalized thickness of the ZnO film H/λ, while the vertical axis represents the electromechanical coupling coefficient. The broken line D, the solid line E and the one dot-chain line F designate the characteristics of the SAW devices 11, 20 and 30, respectively.

FIG. 6 reveals that by adjusting the thickness of the ZnO film 12, the SAW device 30 achieves the largest electromechanical coupling coefficient and the SAW device 11 obtains the second largest coefficient, but on the other hand, in the SAW device 20 the coupling coefficient decreases as the thickness of the ZnO film is increased. More specifically, as is seen from FIG. 6, by comparison of ST-cut X-direction propagating quartz substrates without disposing a ZnO film thereon, the quartz substrate having IDTs formed between the substrate and the ZnO film exhibits only a smaller electromechanical coupling coefficient, while the quartz substrate having IDTs formed on the ZnO film achieves a larger coupling coefficient. Further, an even larger electromechanical coupling coefficient can be achieved by inserting a short-circuit electrode at the interface between the quartz substrate and the ZnO film.

Hence, contrary to the conventional knowledge discussed in the Description of the Related Art, in the ST-cut X-direction-propagating quartz substrate, IDTs, i.e., comb-like electrodes, are formed on the thin ZnO film so as to obtain a large electromechanical coupling coefficient.

EXAMPLE 2

Quartz substrates rotated at about 165° in the Y direction and propagating in the X direction (having Eulerian angles of approximately 0°, 75°, 0°) having a diameter of about 76.2 mm and a thickness of about 0.5 mm were used to produce the following three types of SAW devices 40, 50 and 60 (not shown).

The SAW device 40 was produced in a manner similar to the SAW device 11 of Example 1, except that the Y-direction rotated and X-direction-propagating quartz substrate was used as a quartz substrate. Further, the SAW device 50 was made in a manner similar to the SAW device 20 of Example 1, except that the Y-direction-rotated and X-direction-propagating quartz substrate was used as a quartz substrate. The SAW device 60 was also made in a manner similar to the SAW device 30 of Example 1, except that the Y-direction-rotated and X-direction-propagating quartz substrate was used as a quartz substrate. In the above-described SAW devices 40, 50 and 60, the thickness of the ZnO film was varied to determine the relationship between the thickness of the ZnO film and the electromechanical coupling coefficient. The results are shown in FIG. 7.

Figure 7:
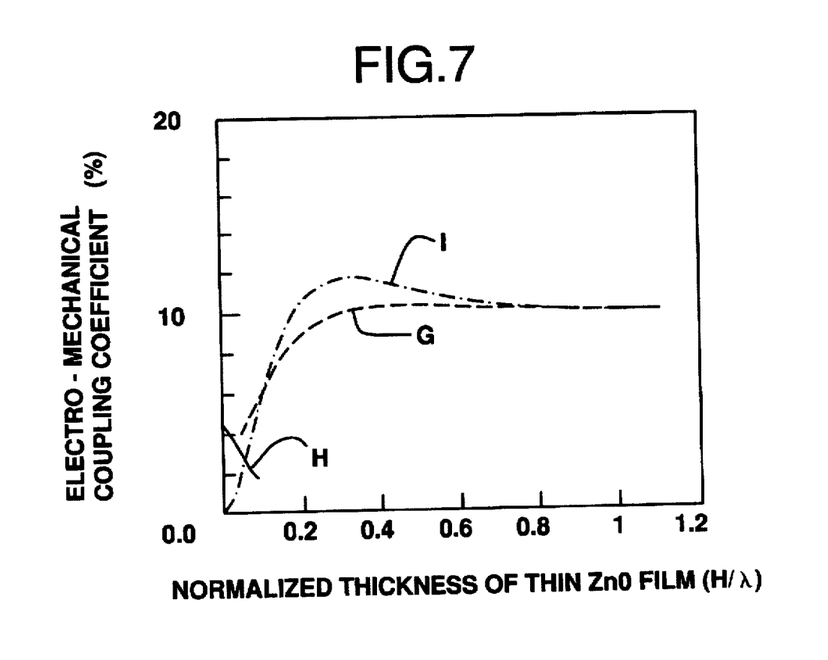
FIG. 7 is a diagram designating the relationship between the electromechanical coupling coefficient and the normalized thickness of a thin ZnO film for use in three types of SAW devices each having a thin ZnO film and comb-like electrodes variously formed on a quartz substrate rotated at about 165° in the Y direction and propagating in the X direction.

Referring to FIG. 7, the broken line G, the solid line H and the one-dot-chain line I depict the characteristics of the SAW devices 40, 50 and 60, respectively. As is seen from FIG. 7, by use of the Y-direction-rotated and X-direction propagating quartz substrate, as well as using the ST-cut X-direction-propagating quartz substrate in Example 1, a larger electromechanical coupling coefficient can be acquired when IDTs, i.e., comb-like electrodes, are formed on the ZnO film rather than when the electrodes are disposed between the ZnO film and the substrate. Additionally, comparison between the characteristics of the SAW devices 40 and 60 indicated by the broken line G and the one-dot chain line I clearly demonstrates that an even larger electromechanical coupling coefficient can be obtained by further inserting a short-circuit electrode between the substrate and the ZnO film.

It has been confirmed by Examples 1 and 2 that SAW substrates having ZnO film formed on the quartz substrates, whichever cut angles the substrates have, can be used to achieve a large electromechanical coupling coefficient by forming comb-like electrodes on the ZnO film.

EXAMPLE 3

A quartz substrate rotated at 115° in the Y direction having a diameter of about 76.2 mm and a thickness of about 0.5 mm was used. This quartz substrate having the above-mentioned cut angle is one of the substrate materials that are known to exert the largest electromechanical coupling coefficient when the leaky SAW, which propagates in the X direction, is excited.

The aforesaid quartz substrates were employed to produce the following SAW devices 70, 80 and 90 using the leaky SAW. The SAW device 70 was made in a manner similar to the SAW device 11 of Example 1, except that the quartz substrate rotated at about 115° in the Y direction was used. The SAW device 80 was also formed in a manner similar to the SAW device 20 of Example 1, except that the above-described quartz substrate was used. Further, the SAW device 90 was made in a manner similar to the SAW device 30 of Example 1, except that the above-described quartz substrate was used.

Figure 8:
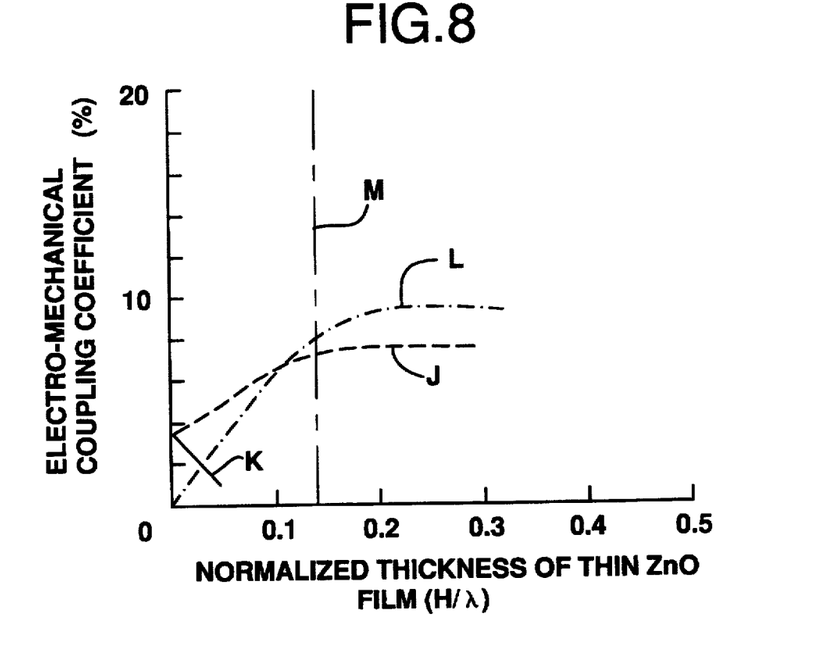
FIG. 8 is a diagram illustrating the relationship between the electromechanical coupling coefficient and the normalized thickness of a thin ZnO film for use in three types of SAW devices each having a thin ZnO film and comb-like electrodes variously formed on a quartz substrate rotated at about 115° in the Y direction.

The thickness of the ZnO film of the above-described SAW devices 70, 80 and 90 was varied to determine the relationship between the thickness of the film and the electromechanical coupling coefficient. The results are shown in FIG. 8. In FIG. 8, the broken line J, the solid line K and the one-dot chain line L indicate the characteristics of the SAW devices 70, 80, 90, respectively.

Further, the characteristics shown in FIG. 8 are differentiated by the case where the excited SAW is a leaky SAW or a normal Rayleigh SAW. More specifically, FIG. 8 reveals that the leaky SAW accompanied by attenuation is excited when the normalized thickness of the thin ZnO film H/λ is less than about 0.14 (equal to the position indicated by the two dot-chain line M), and thus, the resulting SAW substrate is not suitable for transversal-type SAW devices requiring propagation. However, the above type of SAW substrates may be used for a SAW device that does not require propagation. As a consequence, the normalized thickness H/λ of the ZnO film is set to be about 0.14 or greater so as to achieve a SAW device having a large electromechanical coupling coefficient that is free from attenuation.

FIG. 8 also shows that the leaky SAW cannot be effectively excited in the SAW device 80 having IDTs, i.e., comb-like electrodes, formed between the quartz substrate and the ZnO film. In contrast, according to the SAW devices 70 and 90 having comb-like electrodes disposed on the ZnO film, there can be provided SAW devices making use of a leaky SAW that exhibit a large electromechanical coupling coefficient free from attenuation. The leaky SAW has, as shown in FIG. 10, different propagation constants indicating the attenuation by the cut angle of the substrate. Although attenuation of about 0.2 dB/λ is caused by the quartz substrate rotated at about 115° in the Y direction and propagating in the X direction employed in this example, there is no attenuation at all depending on the cut angle (for example, a substrate rotated at about 105° in the Y direction and propagating in the X direction and a substrate rotated at about 30° in the Y direction and propagating in the X direction). The quartz substrates having such cut angles achieve a large electromechanical coupling coefficient, since no attenuation occurs when the normalized thickness of the ZnO/ H/λ is greater than about 0.05.

The comparison between the characteristics of the SAW devices illustrated in FIGS. 6 through 8 clearly indicates that the normalized thickness H/λ of the ZnO film that causes the SAW to be excited is varied depending on the cut angle of the quartz substrate to be used. More specifically, the H/λ should be about 0.05 or greater when the Rayleigh SAW is excited on the ST-cut X-direction-propagating quartz substrate and the quartz substrate rotated at about 165° in the Y direction and propagating in the X direction. On the other hand, the H/λ should be about 0.14 or greater when the leaky SAW is excited on the quartz substrate rotated at about 115° in the Y direction and propagating in the X direction, while the H/λ should be about 0.05 or greater when the leaky SAW is excited on the quartz substrate rotated at about 105° in the Y direction and propagating in the X direction. Accordingly, when the thin ZnO film is disposed on the quartz substrate, the normalized thickness H/λ of the ZnO film is desirably equal to about 0.05 or greater.

As described above, since the various Y-direction-rotated substrates having different Eulerian angles were used for the quartz substrate, a large number of SAW devices using the above quartz substrates having different Eulerian angles were produced. The relationship between the Eulerian angles of the SAW devices and the electromechanical coupling coefficient $K^2$ is indicated by the mark O shown in FIG. 16A.

Figure 16A:
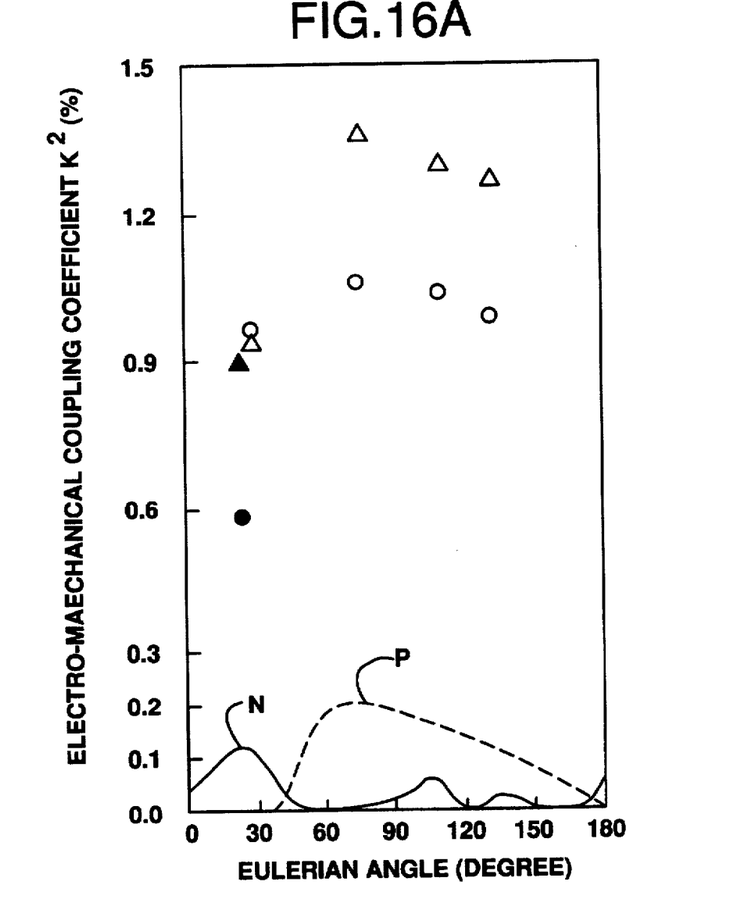
FIG. 16A illustrates the relationship between the electromechanical coupling coefficient and the Eulerian angles of a Y-direction rotating quartz substrate according to another preferred embodiment of the present invention.
Figure 16B:
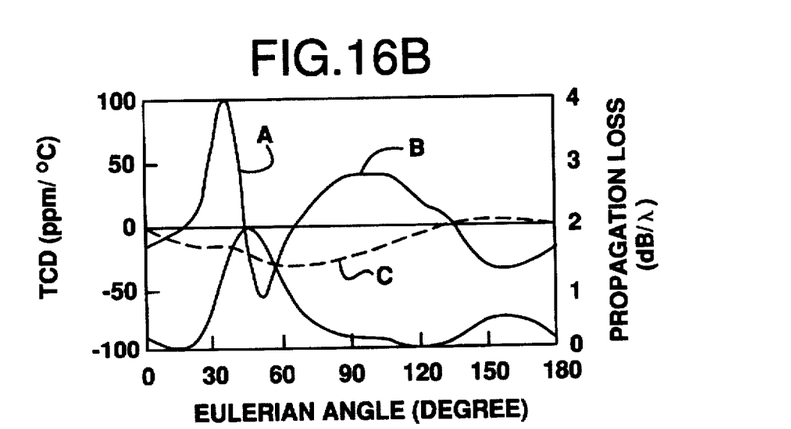
FIG. 16B illustrates the relationship of the Eulerian angles to the TCD and the propagation losses.

Referring to FIG. 16A, the solid line N and the broken line P represent the electromechanical coupling coefficient inherent in the Y-direction-rotated and X-direction propagating quartz substrates using the leaky SAW and the Rayleigh SAW, respectively. The marks O and • in FIG. 16A indicate the squares of the electromechanical coupling coefficients $K^2$ of the SAW devices using the Rayleigh SAW and the leaky SAW, respectively, when the SAW devices are constructed in such a manner that the ZnO film is formed on the quartz substrate and the IDTs are disposed on the film. On the other hand, the marks △ and ▲ designate the squares of the electromechanical coupling coefficients $K^2$ of the SAW devices using the Rayleigh SAW and the leaky SAW, respectively, when the SAW devices are constructed in such a manner that a short-circuit electrode is further disposed at the interface between the ZnO film and the quartz substrate. In this manner, there is a slight variation in the $K^2$ depending on the cut angle. FIG. 16B is the same diagram of FIG. 10 and is given for the purpose of providing a comparison with FIG. 16A.

EXAMPLE 4

As has been explained by referring to FIG. 10, for forming a SAW device using a quartz substrate, a quartz substrate having such a cut angle as to exhibit a TCD of approximately zero is conventionally used for improving temperature characteristics. However, a sufficiently large electromechanical coupling coefficient cannot be obtained. The present inventor discovered that a quartz substrate having a negative TCD and a thin ZnO film are combined to obtain good TCD and a large electromechanical coupling coefficient, based on the relationship between the Eulerian angles and the TCD shown in FIG. 10. It should be noted that the cut angle and the propagation direction of the quartz substrate be related to the TCD so that there is a region in which the TCD of any quartz substrate has a negative value. This will be explained with reference to FIGS. 11 through 14.

Figure 11:
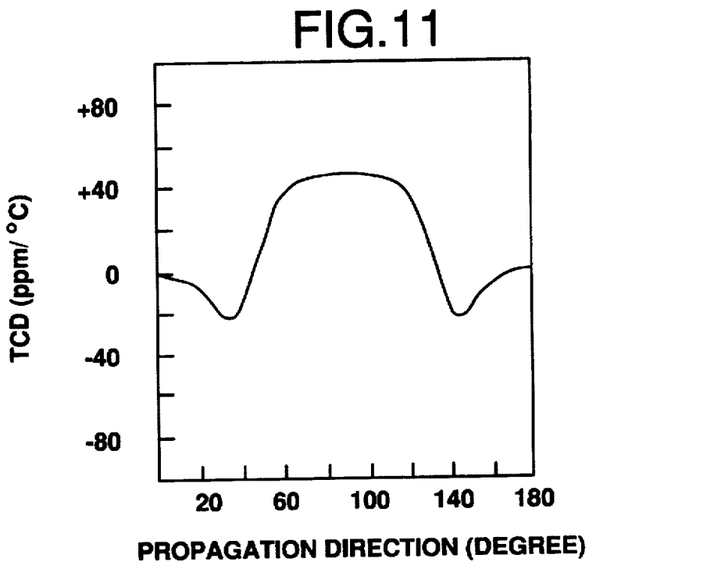
FIG. 11 illustrates the relationship between the propagation direction of a ST-cut quartz substrate and the TCD.
Figure 12:
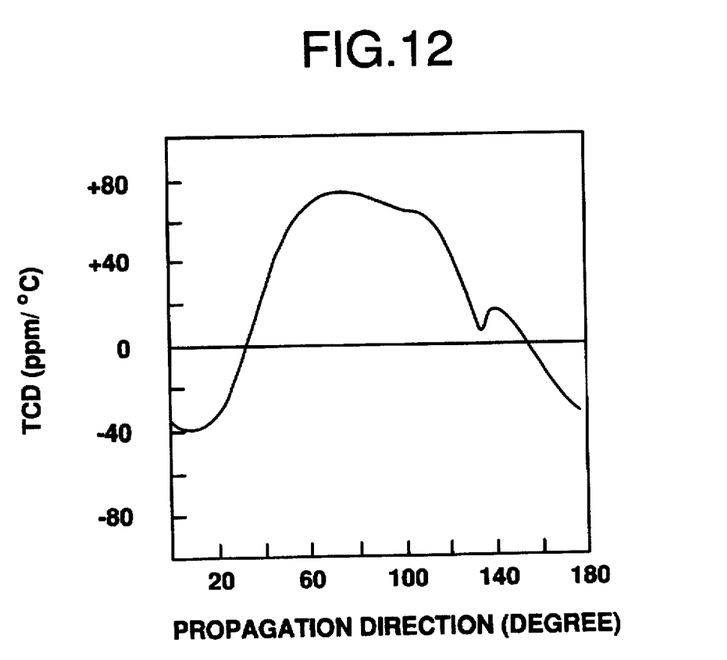
FIG. 12 illustrates the relationship between the propagation direction of an X-cut quartz substrate and the TCD.
Figure 13:
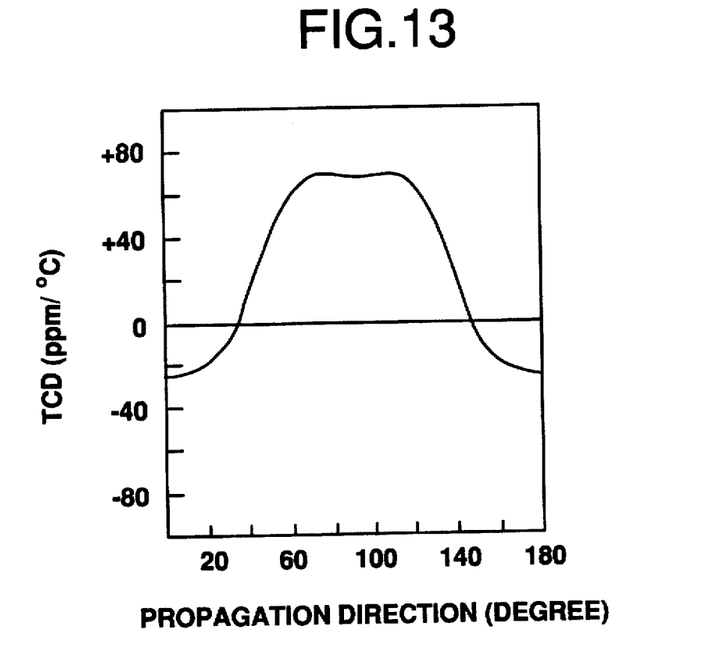
FIG. 13 illustrates the relationship between the propagation direction of a Y-cut quartz substrate and the TCD.
Figure 14:
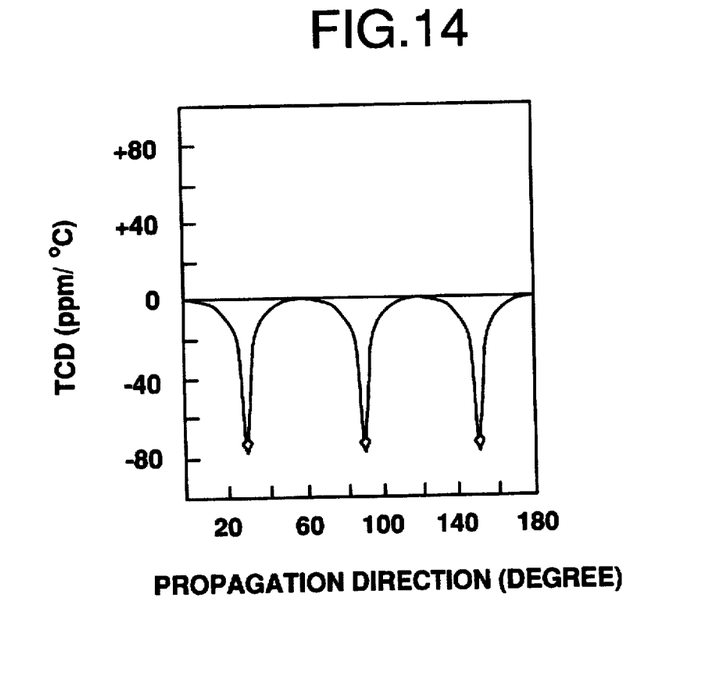
FIG. 14 illustrates the relationship between the propagation direction of a Z-cut quartz substrate and the TCD.

FIG. 11 illustrates the relationship between the TCD and the angle θ from the X axis of the propagation direction of a ST-cut quartz substrate; FIG. 12 indicates the relationship between the TCD and the angle θ from the Y axis of the propagation direction of a X-cut quartz substrate; FIG. 13 designates the relationship between the TCD and the angle θ from the X axis of the propagation direction of a Y-cut quartz substrate; and FIG. 14 illustrates the relationship between the TCD and the angle θ from the X axis of the propagation direction of a Z-cut quartz substrate. FIGS. 11 through 14 demonstrate that there are regions in which the TCD of the quartz substrates has negative values by changing the angle θ of the propagation direction.

According to another preferred embodiment of the present invention, a quartz substrate having such a cut angle or a propagation direction as to exhibit a negative value of TCD is combined with such a thin piezoelectric film as to present a positive value of TCD, thereby implementing good TCD and a large electromechanical coupling coefficient. This will now be explained by way of a Y-direction-rotated quartz substrate as an example, while referring to FIG. 15.

Figure 15:
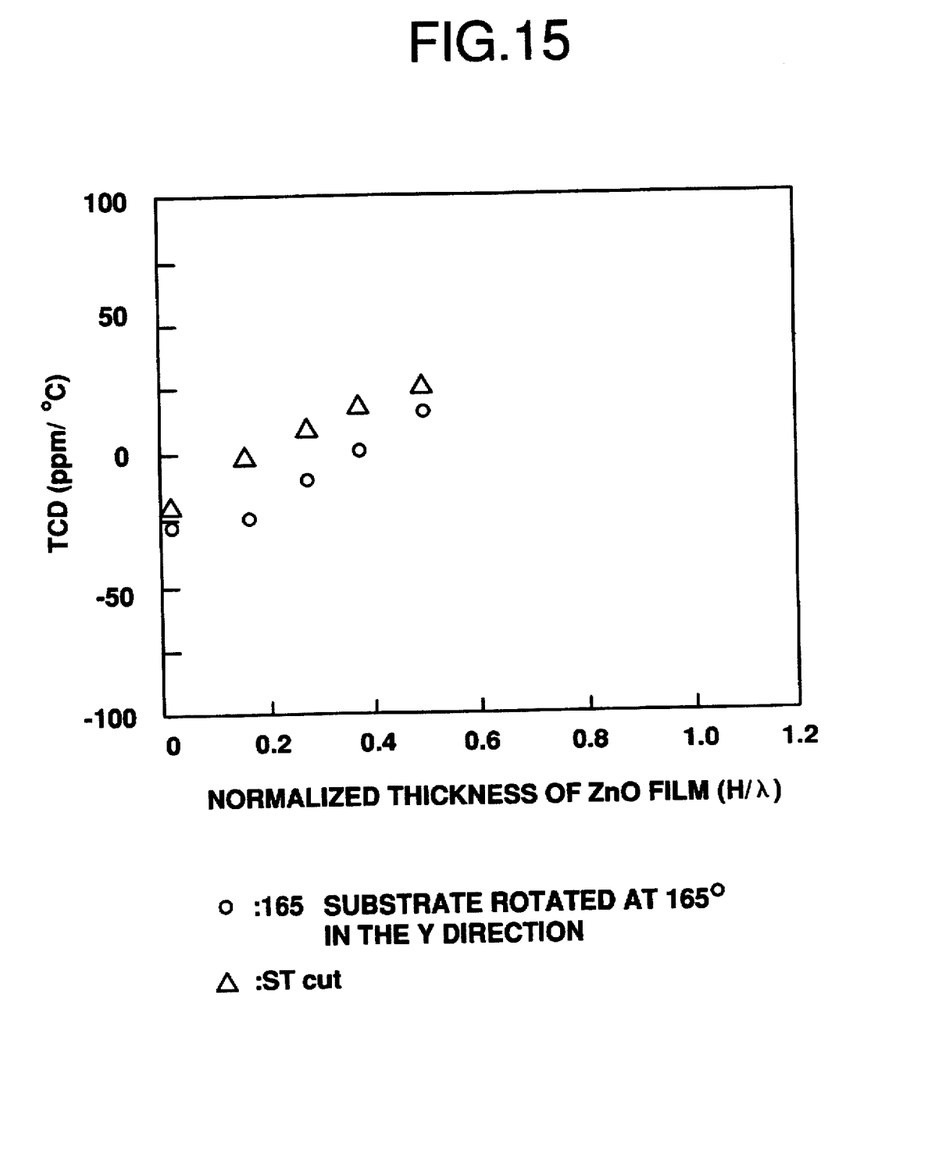
FIG. 15 illustrates the relationship between the normalized thickness of the ZnO film and the TCD when a quartz substrate rotated at about 165° in the Y direction and propagating in the X direction and a quartz substrate propagating inclined at about 35° from the X direction are used.

A substrate rotated at about 165° in the Y direction and propagating in the X direction and a ST-cut substrate propagating inclined at about 35° from the X direction, both having a diameter of about 76.2 mm and a thickness of about 0.5 mm, were used. A ZnO film having a normalized thickness H/λ of a range from about 0 to about 0.5 was formed on each of the quartz substrates, and IDTs were formed on the film along the above-described propagation directions. SAW devices were thus produced. The temperature characteristics (three points at 15° C., 25° C. and 35° C.) indicated by the TCD of the resulting SAW devices were measured. The results are shown in FIG. 15. FIG. 15 clearly shows that the TCD becomes zero when the H/λ is around 0.35 in the substrate rotated at about 165° in the Y direction and propagating in the X direction and when the H/λ is around 0.16 in the ST-cut 35°-propagating substrate. As discussed above, a large electromechanical coupling coefficient can be achieved by the SAW substrates having the above-described levels of H/λ. More specifically, in the substrate rotated at about 165° in the Y direction and propagating in the X direction, the electromechanical coupling coefficient $K^2$ was increased from 0.2% to 1.04%, which is about five times as large as the conventional value, and TCD was raised from −30 ppm/°C. to 0 ppm/°C. by forming the ZnO film having a normalized thickness H/λ of approximately 0.35 on the quartz substrate and disposing IDTs on the film. Moreover, by providing a short-circuit electrode between the ZnO film and the quartz substrate, the TCD reached 0 ppm/°C., and the coupling coefficient $K^2$ was further increased to 1.35%.

On the other hand, in the ST-cut 35°-propagating substrate, as well as in the substrate rotated at about 165° in the Y direction and propagating in the X direction, the electromechanical coupling coefficient $K^2$ was increased from 0.14% to 0.77%, which is 4.8 times as large as the conventional value, and the TCD was raised from −20 ppm/°C. to 0 ppm/°C. by forming the ZnO film having a normalized thickness H/λ of approximately 0.16 on the quartz substrate and disposing the IDTs on the film. Moreover, a short-circuit electrode was further inserted between the ZnO film and the quartz substrate to obtain 0.89% coupling coefficient $K^2$ and 0 ppm/°C. of the TCD.

Consequently, the following can be validated from the above-described example. A quartz substrate having such Eulerian angles as to exhibit a large electromechanical coupling coefficient is used, in which case, a negative TCD of the substrate can be offset by a positive TCD of a thin ZnO film disposed on the substrate, and IDTs are formed on the film. This provides a SAW device exhibiting a very large electromechanical coupling coefficient and possessing good temperature characteristics.

Although an explanation has been given of the aforesaid example only by use of the two types of substrates, other types of quartz substrates rotated in the Y direction and other cut angles, such as shown in FIGS. 11 through 14, may be used, in which case, advantages similar to those achieved in the above-described example can be obtained. More specifically, as illustrated in FIG. 10, in the Y-direction-rotated and X-direction-propagating substrate, by use of the Rayleigh SAW, the TCD becomes negative in a region in which the Eulerian angles range from (0, 0, 0) to (0, 135, 0), while by use of the leaky SAW, the TCD becomes negative in regions in which the Eulerian angles range from (0, 0, 0) to (0, 20, 0), from (0, 45, 0) to (0, 65, 0), and from (0, 135, 0) to (0, 180, 0). On the other hand, by use of the ST-cut quartz substrate, as shown in FIG. 11, the TCD becomes negative in regions in which the Eulerian angles range from (0, 132.75±5, 0) to (0, 132.75±5, 50), and from (0, 132.75±5, 130) to (0, 132.75±5, 180).

Moreover, by the use of the rotated X-cut quartz substrate, as illustrated in FIG. 12, the TCD becomes negative in regions in which the Eulerian angles range from (90, 90, 0) to (90, 90, 35) and from (90, 90, 145) to (90, 90, 180).

Similarly, with the use of the rotated Y-cut quartz substrate, as illustrated in FIG. 13, the TCD becomes negative in regions in which the Eulerian angles range from (0, 90, 0) to (0, 90, 35) and from (0, 90, 145) to (0, 90, 180). Further, by using the Z-cut quartz substrate, as shown in FIG. 14, the TCD becomes negative when the value φ of the Eulerian angles (0, 0, φ) is other than 0, 60, 120 and 180.

In this manner, the TCD exhibits negative values in the above-described ranges of the Eulerian angles. Even in such ranges, however, the cut angle is selected so as to obtain a large electromechanical coupling coefficient, and a thin ZnO film having a positive TCD is formed on each of the quartz substrates in order to cancel the negative values of the TCD. Then, IDTs are further formed on the film. It is thus possible to provide SAW devices exhibiting a large electromechanical coupling coefficient and possessing good temperature characteristics.

Although in the above-described example the thin ZnO film was used as a thin piezoelectric film, other types of piezoelectric film formed of, for example, AlN, $Ta_2O_5$, CdS, may be used as required. Additionally, either of the positive or negative surface of the quartz substrate may be employed.

As will be clearly understood from the foregoing description, the preferred embodiments of the present invention offer the following advantages.

According to one advantage of the preferred embodiments of the present invention, it is possible to provide a SAW device having a large electromechanical coupling coefficient, since comb-like electrodes are disposed on a thin piezoelectric film formed on a quartz substrate. This structure can significantly improve the electromechanical coupling coefficient over the conventional structure in which comb-like electrodes are disposed between the quartz substrate and the piezoelectric film, which used to be considered to be effective for attaining a large coupling coefficient.

According to another advantage of the preferred embodiments of the present invention, a quartz substrate having such a cut angle and a propagation direction as to exhibit a negative value of the TCD is employed, and a thin piezoelectric film is formed on the substrate. Consequently, a piezoelectric film, normally having a positive TCD, can offset a negative TCD inherent in the quartz substrate, thereby achieving a SAW device having good temperature characteristics. In this manner, a negative TCD can be overcome by the use of a quartz substrate having such a cut angle and a propagation direction as to present a large electromechanical coupling coefficient and by forming a piezoelectric film on the substrate. This makes it possible to provide a SAW device possessing good temperature characteristics and exhibiting a large electromechanical coupling coefficient, which cannot be achieved by the conventional SAW devices.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A surface acoustic wave device comprising:

a quartz substrate;

a piezoelectric film disposed on said quartz substrate; and a plurality of comb-like electrodes disposed to contact said piezoelectric film, wherein said quartz substrate comprises a crystalline quartz material having a cut angle and a propagation direction which provide a negative value of temperature coefficient of delay.

2. A surface acoustic wave device according to claim 1, wherein said plurality of comb-like electrodes are disposed on said piezoelectric film.

3. A surface acoustic wave device according to claim 2, further comprising a short-circuit electrode disposed between said quartz substrate and said piezoelectric film.

4. A surface acoustic wave device according to claim 1, wherein a normalized thickness H/λ of said piezoelectric film is about 0.03 or greater where a thickness of said piezoelectric film is H and a wavelength of a surface acoustic wave is λ.

5. A surface acoustic wave device according to claim 1, wherein said piezoelectric film comprises one of a compound selected from the group consisting of ZnO, AlN, $Ta_2O_5$ and CdS.

6. A surface acoustic wave device according to claim 1, wherein said quartz substrate comprises an ST-cut X-direction-propagating quartz substrate.

7. A surface acoustic wave device according to claim 1, wherein said quartz substrate comprises a Y-direction-rotated and X-direction propagating quartz substrate.

8. A surface acoustic wave device according to claim 7, wherein said Y-direction rotated and X-direction-propagated quartz substrate is rotated at an angle of about 165°.

* * * * *